United States Patent [19]

Herrmann et al.

[11] Patent Number: 4,842,990
[45] Date of Patent: Jun. 27, 1989

[54] PRESENSITIZED NEGATIVE WORKING WATERLESS PLANOGRAPHIC PRINTING PLATE WITH AMORPHOUS SILICIC ACID INTERLAYER AND PROCESS OF MAKING AND USING

[75] Inventors: Heinz Herrmann; Hans-Joachim Schlosser, both of Wiesbaden; Susanne Billino, Ruesselsheim, all of Fed. Rep. of Germany

[73] Assignee: Hoechst Aktiengesellschaft, Frankfurt am Main, Fed. Rep. of Germany

[21] Appl. No.: 87,619

[22] Filed: Aug. 20, 1987

[30] Foreign Application Priority Data

Aug. 23, 1986 [DE] Fed. Rep. of Germany ....... 3628720

[51] Int. Cl.$^4$ .............. G03C 1/495; G03C 1/74; G03C 7/10
[52] U.S. Cl. .................. 430/272; 430/270; 430/271; 430/303
[58] Field of Search ............. 430/271, 272, 303, 270

[56] References Cited

U.S. PATENT DOCUMENTS

| | | | |
|---|---|---|---|
| 2,714,066 | 7/1955 | Jewett et al. ............ | 430/302 |
| 3,181,461 | 5/1965 | Fromson ............... | 430/278 |
| 3,511,178 | 5/1970 | Curtin ................. | 101/450 |
| 4,054,094 | 10/1977 | Caddell et al. .......... | 430/302 |
| 4,101,323 | 7/1978 | Buhr et al. ............. | 96/35 |
| 4,247,611 | 1/1981 | Sander et al. .......... | 430/286 |
| 4,311,782 | 1/1982 | Buhr et al. ............ | 430/270 |
| 4,326,020 | 4/1982 | Golda et al. ........... | 430/155 |
| 4,342,820 | 8/1982 | Kinashi et al. ......... | 430/11 |
| 4,347,303 | 8/1982 | Asano et al. .......... | 430/303 |
| 4,358,522 | 11/1982 | Fujita et al. ........... | 430/166 |
| 4,376,814 | 3/1983 | Walls ................. | 430/159 |

FOREIGN PATENT DOCUMENTS 0100938 2/1984 European Pat. Off. .
0154980 9/1985 European Pat. Off. .

OTHER PUBLICATIONS

English Language Abstract of Japanese Publication 58-60,744 published 4/1983.
"Chemical Abstracts", vol. 100, No. 20, May 14, 1984, p. 568.
"Chemical Abstracts", Radiation Chem., Photochem, vol. 93, Dec. 1980, No. 12, p. 543.

*Primary Examiner*—Charles L. Bowers, Jr.
*Attorney, Agent, or Firm*—Foley & Lardner, Schwartz, Jeffery, Schwaab, Mack, Blumenthal & Evans

[57] ABSTRACT

A presensitized printing plate suitable for waterless planographic printing is disclosed which comprises a layer support, a radiation-sensitive layer containing (a) a compound possessing at least one C—O—C bond, which can be split by acid
(b) a compound forming a strong acid upon irradiation, and
(c) a water-insoluble binder, an outer, ink-repellent, crosslinked silicone elastomer layer, and an intermediate layer comprising amorphous silicic acid by which the adhesion of the silicone elastomer layer to the radiation-sensitive layer is improved. The photosensitivity of this printing plate is considerably improved, as compared to known negative-working printing plates that can be used for waterless offset printing. The processes of making and using the presensitized printing plate are also disclosed.

20 Claims, No Drawings

PRESENSITIZED NEGATIVE WORKING WATERLESS PLANOGRAPHIC PRINTING PLATE WITH AMORPHOUS SILICIC ACID INTERLAYER AND PROCESS OF MAKING AND USING

BACKGROUND OF THE INVENTION

The present invention relates to a presensitized printing plate for waterless planographic printing, in particular offset printing, and to a process for preparing a printing form by exposure and development of said printing plate. The printing plate of this invention comprises a layer support, a radiation-sensitive layer and an outer, ink-repellent layer of silicone rubber.

Printing plates as described above and comprising positive-working or negative-working radiation-sensitive, in particular photosensitive, layers have, for example, been disclosed by U.S. Pat. No. 3,511,178. Diazonium salt condensation products are employed as negative-working, i.e., photocurable photosensitive compounds. The exposed printing plate is developed by means of a solution in which the unexposed portions of the photosensitive layer are dissolved and the silicone rubber layer is swollen. The silicone rubber portions on top of the soluble layer portions can be removed by rubbing. The printing form obtained is ink-receptive in the bared areas of the layer support, whereas the silicone rubber layer still present in the non-exposed areas of the layer support is ink-repellent. Thus, the printing form prints a negative image of the transparency employed for exposure. Insoluble precipitation products of diazonium salts and phosphotungstic acid are used as positive-working photosensitive compounds. In this case, an intermediate layer comprising a diazonium salt/formaldehyde condensate is provided between the photosensitive layer and the silicone rubber layer, in order to anchor the latter to the photosensitive layer. This intermediate layer is crosslinked by heat when the silicone elastomer layer is cured into the silicone rubber layer and then effects the desired improved adhesion.

There are also known planographic printing plates suitable for waterless printing, wherein other layers which are rendered soluble by exposure are used. Practically all of these plates require an appropriate adhesive layer.

According to German Offenlegungsschrift No. 29 43 379 (U.S. Pat. No. 4,358,522), a photosensitive layer of an o-quinonediazide and a novolak is coated with an intermediate layer of an adhesion-promoting aminoalkyl-alkoxysilane.

German Offenlegungsschrift No. 30 45 979 (U.S. Pat. No. 4,342,820) describes a combination of a particular o-quinonediazide layer and a silicone rubber layer. To improve the adhesion between these layers, silicones or silanes can be added to either one of these layers, or an adhesive layer comprising compounds of this type can be applied between the two layers.

According to the teaching of Japanese Patent Application No. 58/60744, improved adhesion is achieved by the addition of aminosilane and tetra-isopropoxytitanium to the silicone layer or by an adhesive layer comprising organotitanium compounds.

European Patent Application No. 0,100,938 describes a process for improving the adhesion of corresponding layers by a short, slight overall exposure and treatment with a base, for example, a primary amine. An intermediate layer of aminosilanes and/or organotitanates may additionally be applied.

European Patent Application No. 154,980 describes a similar, presensitized printing plate wherein the photosensitive o-quinonediazide layer additionally comprises a coupling component which in a basic medium, such as that used for development, undergoes a coupling reaction with the non-decomposed diazo compound in the unexposed areas, whereby a relatively insoluble azo dye is formed. At the same time the silicone layer is more firmly anchored to the quinonediazide layer during the coupling reaction. Additionally an adhesive layer, for example, of aminosilanes or organotitanium compounds, may be present between the aforementioned layers.

These known negative-working printing plates for waterless offset printing which are based on diazonium salts or quinone diazides have a relatively low photosensitivity. Often the adhesion can only be improved by a complicated composition of the material and additional process steps. In most cases mixtures of water-insoluble and polar organic solvents are required to develop these plates. The predominant portion of the mixtures of water-miscible solvents and water, which can be employed in some cases, comprises organic solvents. Due to this high solvent content special precautionary measures must be taken in order to prevent excessive pollution of the waste water and exhaust air.

Positive-working photosensitive compositions based on compounds which in photolytic reactions form an acid and compounds which are split by acid, for example, orthocarboxylic acid esters and acetals, have also been disclosed. These compositions can be used in the production of photosensitive layers (e.g., for printing plates) whose photosensitivity is considerably increased over that of naphthoquinonediazide layers. Compositions of this type are, for example, described in German Patent Nos. 26 10 842 (U.S. Pat. No. 4,101,323) and 27 18 254 (U.S. Pat. No. 4,247,611) and in European Patent Application No. 0,022,571 (U.S. Pat. No. 4,311,782).

Related application Ser. No. 087,677, filed Aug. 20, 1987 (German Application No. P 36 28 719.9), assigned to the assignee of the present invention and filed concurrently with this application, discloses a presensitized printing plate comprising an amorphous silicic acid between a radiation-sensitive layer and an ink-repellent silicone layer. This application is incorporated herein by reference.

SUMMARY OF THE INVENTION

It is an object of the present invention to provide a negative-working printing plate suitable for waterless offset printing, which has a higher photosensitivity than the comparable known printing plates.

It is a further object of the invention to provide a negative-working printing plate which can be treated with developing solutions predominantly comprised of water.

It is yet another object of the invention to provide a negative-working printing plate which possesses a crosslinked silicone elastomer layer which is firmly anchored to the photosensitive layer.

In accordance with these and other objects of the present invention, there is disclosed a presensitized printing plate for waterless planographic printing, which comprises a layer support, a radiation-sensitive layer rendered soluble by exposure, an outer, ink-repellant, crosslinked silicone elastomer layer and an intermediate layer by which the adhesion of the silicone elastomer layer to the radiation-sensitive layer is improved.

In the printing plate according to this invention the radiation-sensitive layer comprises, as the essential constituents, (a) a compound possessing at least one C—O—C bond which can be split by acid (b) a compound forming a strong acid upon irradiation, and (c) a water-insoluble binder. The intermediate layer is comprised of amorphous silicic acid. The process of making this presensitized plate is also disclosed.

In accordance with this invention, there is disclosed a process for preparing a printing form for waterless planographic printing using the presensitized printing plate. In this process, a presensitized planographic printing plate as described above is immersed into an aqueous solution containing a water-miscible organic solvent, and the photosensitive layer, together with the superimposed silicone rubber layer, is subsequently removed from the exposed areas by rubbing.

DESCRIPTION OF THE PREFERRED EMBODIMENTS

The intermediate layers of the printing plates are preferably produced by coating a diluted silicic acid sol onto the radiation-sensitive, in particular photosensitive, layer and drying the applied sol.

If this adhesive layer is not applied, the adhesion of silicone rubber layers which are coated onto photosensitive layers based on acid-cleavable materials is totally insufficient. It has been found that adhesive layers comprising silanes, for example, aminoalkylsilanes, which are usually applied to naphthoquinonediazide layers, result in a certain improvement of the adhesion between the unexposed, acid-cleavable layer and the silicone layer. However, these silane layers either adversely affect the processing of the printing plate or their anchoring effect is so poor that the imagewise exposed plate cannot be developed to give an acceptable printing stencil.

The silicic acid sols employed for the production of the adhesive layers usually comprise silicic acid particles having sizes between 5 and 150 nm, preferably between 20 and 50 nm. The aqueous silicic acid sols may be stabilized at an alkaline or acid pH value. To achieve improved wetting of the photosensitive layer, it is advantageous to mix the sol with a small amount of a water-soluble surfactant, in particular an anionic or non-ionic surfactant. Suitable substances include, for example, alkali metal salts of long-chain alkanoic acids, alkylsulfonic acids, monoalkylsulfates, alkylbenzenesulfonic acids, and polyalkoxyphenol ethers. Since the surfactants themselves impede strong adhesion, their amount preferably should be kept as low as possible. In general, the preferred amount of surfactant varies between 1% and 15% by weight, relative to the solids content of the sol.

The silicic acid layer is bonded particularly well to the photosensitive layer if the silicic acid sol is allowed to diffuse somewhat into the photosensitive layer. Since the depth of penetration decreases as the photosensitive layer gets dry, the adhesive layer should be applied before the photosensitive layer is more than incipiently dried. The diffusion can also be controlled by adding water-miscible solvents which cause the positive-working layer to swell to the silicic acid sol. The adhesion of the silicic acid layer can also be improved by enlarging the surface area of the photosensitive layer by means of mechanical graining or by adding pigments.

Apart from the required surfactants and, if appropriate, water-miscible solvents, the silicic acid sols may contain finely divided fillers. The weight of the silicic acid layer can be varied within wide limits, ranging from about 0.01 to 1.0 $g/m^2$. Preferably it is within the range of 0.1 to 0.3 $g/m^2$.

The layer rendered soluble by irradiation can contain, as compounds having acid-cleavable C—O—C bonds, inter alia monomeric and polymeric acetals, monomeric and polymeric orthocarboxylic acid esters, enol-ethers and N-acyliminocarbonates. Mixtures of this type are described in European Patent Application Nos. 0,006,626 and 0,006,627 and in the references mentioned in the background. Polymeric acetals and orthocarboxylic acid esters are particularly preferred. The proportion of acid-cleavable compound is in general about 2% to 75% by weight, preferably about 4% to 30% by weight, relative to the non-volatile constituents of the layer.

A large number of known compounds and mixtures are suitable for use as radiation-sensitive components which on irradiation form or eliminate preferentially strong acids, such as diazonium, phosphonium, sulfonium and iodonium salts, halogen compounds, o-quinonediazide sulfochlorides and organometal/organohalogen combinations.

In principle it is possible to use as halogen-containing radiation-sensitive compounds which form hydrohalogenic acid any organic halogen compound which is also known as a photochemical free-radical starter, for example, those which have more than one halogen atom on a carbon atom or in an aromatic ring. Examples have been described in U.S. Pat. Nos. 3,515,552, 3,536,489 and 3,779,778, German Auslegeschrift No. 2 610 842 and German Offenlegungsschriften Nos. 2 718 259 and 2 243 621.

The amount of the starter can also vary widely according to the chemical nature of the starter and the composition of the mixture. Favorable results are obtained using about 0.1% to 10% by weight, relative to total solids, with about 0.2% to 5% being preferable.

The mixtures also contain a polymeric binder which is insoluble in water and soluble in organic solvents. Since aqueous-alkaline solutions are advantageously used as developer liquids for the exposed copying layers, it is particularly preferred that the binders are soluble, or at least swellable, in aqueous alkalis.

The type and amount of water-insoluble binders can vary according to the intended use; proportions of total solids between about 30% and 90% by weight, in particular between about 55% and 85% by weight are preferable.

Phenolic resins, above all novolaks, have been found to be particularly advantageous binders. Other alkali-soluble resins, such as copolymers of maleic anhydride and styrene, vinyl acetate and crotonic acid, methyl methacrylate and methacrylic acid and the like, are also suitable for use as binders.

Dyestuffs or finely divided pigments can be added to the photosensitive layer. Triphenylmethane dyestuffs, particularly in the form of their carbinol bases, have been found to be particularly suitable.

The photosensitive layer in general has a weight of about 0.3 to 3 $g/m^2$, layer weights between about 0.8 and 1.8 $g/m^2$ being preferred in most cases.

The silicone elastomer layer is applied from a solution in a non-polar solvent, for example aliphatic or aromatic hydrocarbons, in which the constituents of the adhesive and photosensitive layers virtually do not dissolve under the coating conditions. In principle, every silicone elastomer which is sufficiently ink-repellent to permit offset printing without dampening solution, is suitable. Within the scope of this invention "silicone elastomer" is to be understood, in accordance with the definition by Noll, "Chemie und Technologie der Silikone (Chemistry and Technology of Silicones)", Verlag Chemie, 1968, page 332, as a high-molecular weight, substantially linear diorganopolysiloxane, whereas the term "silicone rubber" is used for the crosslinked or vulcanized products. In every case, a silicone elastomer solution is applied to the photosensitive layer, dried and then crosslinked.

Suitable silicone elastomers are single-component and multi-component types such as are described, for example, in German Offenlegungsschriften Nos. 23 50 211, 2 357 871 and 2 359 102.

The single-component silicone elastomers are based on polysiloxanes which contain, for example, terminal acetyl, oxime, alkoxy or amino groups or hydrogen atoms. The remainder of the polysiloxane consists essentially of a dimethylpolysiloxane chain. To a relatively small extent, the methyl groups can also be replaced by other alkyl groups, by halogenoalkylgroups or substituted or unsubstituted aryl groups. The terminal functional groups are easily hydrolyzable and harden under the action of moisture within a period from a few minutes to several hours (RTV-1 silicone elastomers).

The multi-component silicone elastomers can be crosslinkable by addition or by condensation. The addition-crosslinkable types contain in general polysiloxanes with alkenyl groups as substituents and those with hydrogen atoms bonded to silicon. They are crosslinked at temperatures above 50° C. in the presence of platinum catalysts. They have the advantage that they crosslink rapidly at an elevated temperature of, for example, about 100° C. On the other hand, the processing period (pot life) of these systems can be relatively short.

The mixtures crosslinkable by condensation contain diorgano-polysiloxanes with reactive end groups, for example, OH groups and acetoxy groups. These are crosslinked with reactive silanes or oligosiloxanes such as alkoxy silanes or acetoxy silanes or siloxanes which contain several Si-H groups in their molecules, in the presence of catalysts, for example, organo-tin compounds, such as dialkyl tin diacetate. These combinations also react relatively rapidly and have therefore a limited pot life.

Multi-component silicone elastomers which are crosslinkable by condensation are used with particular advantage. The preferred crosslinking agent is vinyl-triacetoxy-silane which ensures the best adhesion to the silicic acid layer and thus to the photosensitive layer. It is also possible to use vinyl-triacetoxy-silane in combination with other crosslinking agents, as long as these do not interfere with the solubilizing reaction of the photosensitive layer. In the absence of alkyl-triacetoxy-silanes, sufficient adhesion can also be achieved by using H-containing siloxanes. In this case, the adhesion is markedly improved during the first few days following the printing plate production, and therefore such plates should be stored for several days before further processing.

The concentration of the crosslinking agent or of the mixture of crosslinking agents, respectively, usually is about 1% to 20% by weight, preferably about 2% to 15%, of the amount of polysiloxane. The amount of catalyst preferably varies between about 2% and 10% by weight of the amount of polysiloxane.

After application of the silicone elastomer layers, the silicone elastomers are crosslinked in the known manner by the action of moisture or by themselves at room temperature or at elevated temperatures to give silicone rubbers which are essentially insoluble in organic solvents. The finished silicone rubber layer in general has a weight from about 1 to 20 g/m$^2$, preferably from about 2 to 6 g/m$^2$.

The dehesive silicone rubber layeriis believed to be anchored to the silicic acid layer via a chemical reaction. It is supposed that a condensation reaction takes place between the hydroxyl groups present on the surface of the silicic acid particles and the hydroxyl groups of the high molecular-weight, non-crosslinked silicone elastomers.

The preferred multi-component silicone elastomers have the advantage that printing plates prepared with them, on printing without dampening solution, show a substantially lower tendency to scumming than those which have been prepared with usual single-component silicone elastomers. The scratch resistance of the surface of the hardened silicone rubber is also increased in the case of the preferred types of compound.

The layer supports used are in most cases metals. The following can be employed for offset printing plates: bright-rolled, mechanically or electrochemically roughened and, if appropriate, anodically oxidized aluminum which, in addition, may also have been pretreated chemically, for example with polyvinylphosphonic acid, silicates, phosphates, hexafluorozirconates or with hydrolyzed tetraethyl orthosilicate. Other suitable metals are steel and chromium. Since, in contrast to conventional planographic printing plates, it is not necessary for the support surface to be hydrophilic, it is also possible with advantage to use copper, brass or other oleophilic metals as the support surface. The support surface may also be provided with a permanent, oleophilic coating, such as an adhesion-promoting layer. Likewise, plastic sheets, such as polyester, polycarbonate, polyimide or cellulose acetate sheets can also be used. If appropriate, the surface of these may have been roughened or pretreated in another way for improving the wettability by printing ink. It is also possible to use known printing plate supports of paper, which for the purposes of this invention must not be absolutely water-resistant. Rubber-elastic support materials are also suitable; such supports also allow printing in direct planographic printing.

In the case of the printing forms prepared from the material according to the invention, the support material serves as the ink-bearing material, in contrast to the otherwise usual printing forms. The silicone rubber layer which remains in place after exposure and development serves as the image background and, in the dry state, has an ink-repellent action. For printing, both conventional oil-based printing inks and special hydrophilic printing inks, such as have been developed for waterless offset printing and reverse offset printing and are commercially available, can here be used. Since most of the usual layer support surfaces, for example grained or anodically oxidized aluminum, are highly hydrophilic, hydrophilic printing inks are used with advantage.

The printing plates according to this invention are produced as follows. First, the printing plate support is coated, as usual, with the photosensitive coating solution. After incipient drying of the layer, the surfactant-containing, diluted silicic acid sol is applied. The dried silicic acid layer is coated with the polysiloxane solution which optionally contains a crosslinking agent and a catalyst. This layer is dried and crosslinked by storing for several hours at room temperature (RTV-1 elastomer) or by moderate heating, for example, during 1 minute to 100° C. to 120° C., and subsequent storing in the dark for several hours at room temperature (RTV-2 elastomer).

By exposure through a negative original and development, a ready-to-print planographic printing form is obtained from the presensitized plate. Mercury lamps, carbon arc lamps, metal halide lamps, xenon lamps, incandescent tubes, laser equipment, electron beams and other known exposure apparatus may be employed for exposure. If the acid-forming compound of the radiation-sensitive layer is not sensitive to visible or ultraviolet light, but rather to high-energy radiation, such as x-rays or corpuscular radiation, appropriate radiation sources are used. During development, the abhesive silicone rubber layer is swollen by the developer solution, and the exposed portions of the radiation-sensitive layer are dissolved. By rubbing with a soft material, such as cotton, tissue or sponge rubber, those portions of the swollen silicone rubber layer which overlie the dissolved, irradiated areas of the photosensitive layer break away, and the surface of the printing plate support is bared. The bared surface readily accepts ink, whereas the remaining silicone layer is ink-repellent. Inking of the developed plate can be performed inside or outside the printing press.

Suitable developers on the one hand must be able to cause strong swelling of the abhesive layer and to penetrate it quickly, and also to develop the exposed areas of the photosensitive layer thoroughly. On the other hand, they must not attack the unexposed areas. Good results are achieved with mixtures of water-miscible solvents and water which optionally has been rendered weakly alkaline by the addition of bases, basic salts, ammonia or amines. Suitable water-soluble solvents include lower alcohols, glycols, glycol ethers, ketones and cyclic ethers. Preference is given to weakly alkaline isopropanol/water mixtures having a water content of more than about 50% and a pH between about 8 and 9.

The ink-repellent non-image areas are raised by a few micrometers relative to the ink-receptive support surface laid bare by the development. These differences in height can be compensated for by filling the depressions with printing ink during the roller application of the ink. When the ink has dried, the ink-receptive and the ink-repellent surface areas are on the same level.

Examples of preferred embodiments of the printing plate according to this invention are described below. Unless otherwise specified, percentages and quantity ratios relate to weight. The presensitized printing plates were produced and processed under yellow light.

EXAMPLE 1

A solution of
4.0 g of a cresol/formaldehyde novolak (melting point 105° C.–120° C.),
1.2 g of a polyacetal of triethylene glycol and 2-ethyl-butyraldehyde,
0.2 g of 2-stilbenyl-4,6-bis-trichloro-methyl-s-triazine, and
0.032 g of crystal violet base, in
80 g of butanone
was spin-coated, at about 60 rpm, on an aluminum foil which had been grained by brushing, and incipiently dried by means of warm air (weight of the completely dried layer 1.1 g/m$^2$). Immediately after its solidification, but while it still contained some solvent, the layer was spin-coated with a solution of
97 g of deionized water,
3 g of a 30% strength anionic silicic acid sol having a pH of about 10 and a particle size of 25 to 30 nm, and
0.07 g of sodium diisobutyl-naphthalene sulfonate.
Spin coating was performed at a speed of about 150 rpm. When both layers were dry, the following solution was applied by spin-coating at about 60 rpm.
84 g of an aliphatic hydrocarbon mixture, boiling range 116° C. to 142° C.,
15 g of a 33% strength solution of a dihydroxy-polydimethyl siloxane in toluene, viscosity at 25° C. 9,000 to 15,000 mPa.s,
0.7 g of vinyl-triacetoxysilane, and
0.3 g of dibutyl-tin diacetate.
The layer was dried and vulcanized by heating it to 110° C. for 1 minute in a drying cabinet. The resulting presensitized printing plate was exposed through a negative original for 15 s, using a 5 kW metal halide lamp arranged at a distance of 140 cm, then immersed into a developer liquid for 75 s and thereafter wiped with a soft cotton pad, whereby all three layers were removed from the exposed areas. The developer employed was composed of
71.722% of deionized water,
28.232% of isopropanol,
0.022% of n-butanol,
0.013% of NaOH, and
0.011% of Na$_2$SiO$_3$ x 9H$_2$O
The printing form could be easily inked with a commercially available waterless offset ink in a small offset press where the dampening unit had been removed. Clean prints were obtained from the form.

EXAMPLE 2

Example 1 was repeated, with the exception that the following photosensitive coating solution was used:
80 g of butanone,
4 g of a cresol/formaldehyde novolak, melting point 105° C. to 120° C.,
0.2 g of the polyacetal of Example 1,
0.2 of 2-(4-ethoxy-naphth-1-yl)-4,6-bis-trichloromethyl-s-triazine, and
0.03 g of crystal violet base.
The developed printing form provided very clean, crisp prints.

EXAMPLE 3

Example 1 was repeated, with the exception that the following photosensitive coating solution was used:
80 g of butanone,
4 g of a cresol/formaldehyde novolak, melting point 105° C. to 120° C.,
0.3 g of a polycondensate of orthoformic acid methyl ester and 2-ethyl-2-hydroxymethyl-4-oxa-1,8-octanediol, 0.2 g of 2-acenaphth-5-yl-4,6-bis-trichloro-methyl-s-triazine, and
0.03 g of crystal violet base.

Waterless offset printing ink was applied to the developed form by means of a roller, and after the ink had dried the form was inserted into a small offset press. Very clean, crisp prints were obtained.

EXAMPLE 4

Aluminum foil which had been grained by brushing was first coated with the coating solution of Example 2 and then with the silicic acid sol of Example 1. Thereupon, a dehesive layer having the following composition was applied by spin-coating:
84 g of the hydrocarbon mixture of Example 1,
15 g of the dihydroxy-polydimethyl siloxane solution of Example 1,
0.35 g of vinyl-triacetoxysilane,
0.35 g of methacryloyloxypropyl-trimethoxysilane and
0.3 g of dibutyl-tin diacetate.

Processing was performed as described in Example 1. More than 5,000 very clean prints were obtained.

EXAMPLE 5

Example 4 was repeated, with the exception that tetraethyl-orthosilicate was used instead of methacryloxyloxypropyl-trimethoxysilane. The printing form gave clean prints.

EXAMPLE 6

Example 2 was modified by using only 0.2 g of vinyl-triacetoxysilane (instead of 0.7 g) in the polysiloxane layer. The printing plate could be easily developed. It provided very clean prints.

EXAMPLE 7

As described in Example 2, aluminum foil which had been grained by brushing was coated with a photosensitive layer and a silicic acid layer. A mixture comprised of 1 part by weight (p.b.w.) of a 75% strength solution in toluene (viscosity about 9,000 mPa.s) of a polysiloxane of the amine type, which is self-crosslinking under the influence of air, and 4 p.b.w. of the aliphatic hydrocarbon mixture indicated in Example 1 was applied to this material, such that a layer weight of about 5 g/m$^2$ resulted after drying. By storing the plate in the ambient air for several hours crosslinking of the silicone layer was achieved.

A printing form was prepared as described in Example 1. In a small offset press, scum-free, crisp prints were obtained.

EXAMPLE 8

Example 7 was repeated, with the exception that another polysiloxane crosslinking under the influence of atmospheric moisture was employed. The photosensitive layer, after having been provided with an adhesion-promoting coating, was spin-coated with the following mixture:
12.5 g of a transparent dispersion containing 60% of the aliphatic hydrocarbon mixture of Example 1, fillers and a polysiloxane of the amine type, having a viscosity of about 1,500 mPa.s, and
87.5 g of the above hydrocarbon mixture.

The layer had a dry weight of 2.2 g/m$^2$. It was crosslinked during storage in the ambient air for several hours.

Clean and crisp prints were obtained from the developed plate.

EXAMPLE 9

Mechanically grained aluminum foil was coated with a coating solution as described in Example 2. The incompletely dried layer was spin-coated with a solution having the following composition:
97.0 g of deionized water,
3.0 g of a 30% strength, cationic silicic acid sol having a pH of about 3.9, and
0.04 g of n-nonylphenol-polyglycol ether.

The dried silicic acid layer was coated with a silicone elastomer as described in Example 1.

When the plate was exposed and developed as described in Example 1, only the silicone rubber layer was removed from the exposed areas, so that the ink-receptive copying layer areas lying underneath were laid bare.

In the small offset press, the developed plate produced a great number of crisp, clean prints.

EXAMPLE 10 (COMPARATIVE EXAMPLE)

Example 1 was repeated, with the exception that, instead of the silicic acid sol indicated therein, a 3% strength solution of vinyl triacetoxysilane in an aliphatic hydrocarbon mixture, having a boiling range of 116° to 142° C., was used to produce the adhesion-promoting intermediate layer, When the imagewise exposed plate was developed, not only the exposed areas were dissolved away, but a noticeable attack to the layer was also noted in the unexposed areas. Due to the insufficient adhesion of the silicone rubber layer, the printing forms produced in this way exhibited damaged image areas.

EXAMPLE 11 (COMPARATIVE EXAMPLE)

Example 1 was repeated, with the exception that, instead of the silicic acid sol described therein, a 3% strength solution of 3-(2-aminoethylamino)-propyl-trimethyoxysilane in an aliphatic hydrocarbon mixture, having a boiling range of 116° to 142° C., was employed. Imagewise exposure of the plate did not cause any solubility differentiation within the copying layer, and therefore it was impossible to develop an image.

What is claimed is:

1. A presensitized printing plate for waterless planographic printing comprising:
   1. a support;
   2. a radiation-sensitive layer on the support comprising
      (a) a compound possessing at least one C—O—C bond, which can be split by acid,
      (b) a compound forming a strong acid upon irradiation, and
      (c) a water-insoluble binder;
   3. an ink-repellent silicone layer; and
   4. an amorphous silicic acid layer between the radiation-sensitive layer and the silicone layer.

2. A printing plate as claimed in claim 1, wherein the intermediate layer is produced by applying and drying an aqueous silicic acid sol.

3. A printing plate as claimed in claim 2, wherein the silicic acid sol contains a water-soluble surfactant.

4. A printing plate as claimed in claim 3, wherein the surfactant is present in an amount between about 1% and 15% by weight relative to the solids content of the sol.

5. A printing plate as claimed in claim 1, wherein the intermediate layer has a weight per unit area of about 0.01 g/m$^2$ to 1 g/m$^2$.

6. A printing plate as claimed in claim 1, wherein the compound possessing at least one acid-cleavable C—O—C bond comprises an orthocarboxylic acid derivative, an acetal, an enol ether or a N-acyliminocarbonate.

7. A printing plate as claimed in claim 1, wherein the water-insoluble binder is soluble in aqueous-alkaline solutions.

8. A printing plate as claimed in claim 7, wherein the binder comprises a novolak.

9. A printing plate as claimed in claim 1, wherein the silicone layer comprises a crosslinkable elastomer.

10. A printing plate as claimed in claim 9, wherein the elastomer comprises a two-component elastomer crosslinkable by condensation reaction at room temperature.

11. A printing plate as claimed in claim 10, wherein the silicone elastomer contains an alkenyltriacetoxysilane as the crosslinking agent.

12. A printing plate as claimed in claim 9, wherein the elastomer comprises a multi-component elastomer.

13. A printing plate as claimed in claim 1, wherein the silicone layer comprises a crosslinked silicone rubber having a weight per unit area of about 1 g/m$^2$ to 20 g/m$^2$.

14. A process for making a presensitized printing plate for waterless planographic printing comprising the steps of:
providing a support layer;
coating on said support layer a radiation-sensitive composition comprising
(a) a compound possessing at least one C—O—C bond which can be split by acid,
(b) a compound forming a strong acid upon irradiation,
(c) a water-insoluble binder, and
(d) a solvent;
coating a silicic acid sol on the radiation-sensitive coating; and
coating an ink-repellent silicone elastomer on the silicic acid coating.

15. A process for making a printing plate for waterless planographic printing as claimed in claim 14, wherein the silicic acid sol is coated before the solvent has completely evaporated from the radiation-sensitive coating.

16. A process for making a printing plate as claimed in claim 15, wherein the silicic acid sol further comprises water-miscible solvents.

17. A process for making a printing plate as claimed in claim 15, wherein the silicic acid sol further comprises a water-soluble surfactant.

18. A process of using the presensitized printing plate of claim 1 to make a printing form suitable for waterless planographic printing comprising the steps of:
imagewise exposing the presensitized plate of claim 1 to radiation to produce exposed and unexposed areas on the
immersing the exposed printing plate in an aqueous solution containing a water-miscible organic solvent; and
removing the radiation-sensitive layer and the overlying silicone layer from the exposed areas of the plate.

19. A process as claimed in claim 18, wherein the solution is an aqueous alkaline solution.

20. A process as claimed in claim 18, wherein the aqueous solution contains at least about 50% of water.

* * * * *